United States Patent
Koeneman

(10) Patent No.: US 6,664,691 B1
(45) Date of Patent: Dec. 16, 2003

(54) FILTER CIRCUIT INCORPORATING A MICRO-ELECTROMECHANICAL CAPACITOR

(75) Inventor: Paul B. Koeneman, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 2 days.

(21) Appl. No.: 10/270,993

(22) Filed: Oct. 15, 2002

(51) Int. Cl.[7] .................. H02K 31/00; H01G 5/01
(52) U.S. Cl. .......... 310/178; 310/40 R; 310/40 MM; 310/DIG. 6; 361/288
(58) Field of Search ............... 310/178, 40 R, 310/40 MM, DIG. 6; 333/133; 361/289, 287

(56) References Cited

U.S. PATENT DOCUMENTS

| | | | |
|---|---|---|---|
| 4,234,139 A | * 11/1980 | Porchia | 361/289 |
| 4,312,025 A | * 1/1982 | Boyer | 361/289 |
| 4,366,402 A | * 12/1982 | Marsoner | 310/68 B |
| 5,241,232 A | * 8/1993 | Reed | 310/178 |
| 5,451,825 A | 9/1995 | Strohm | 310/178 |
| 5,481,149 A | 1/1996 | Kambe et al. | 310/178 |
| 5,530,309 A | 6/1996 | Weldon | 310/178 |
| 5,587,618 A | 12/1996 | Hathaway | 310/178 |
| 5,783,879 A | 7/1998 | Furlani et al. | 310/40 MM |
| 5,821,659 A | 10/1998 | Smith | 310/178 |
| 5,822,839 A | 10/1998 | Ghosh et al. | 29/596 |
| 5,982,608 A | * 11/1999 | Kalnitsky et al. | 361/288 |
| 6,051,905 A | 4/2000 | Clark | 310/178 |
| 6,074,888 A | 6/2000 | Tran et al. | 438/39 |

FOREIGN PATENT DOCUMENTS

| | | | |
|---|---|---|---|
| WO | WO 95/08210 | 3/1995 | H02K/19/18 |

* cited by examiner

*Primary Examiner*—Burton Mullins
(74) *Attorney, Agent, or Firm*—Akerman Senterfitt

(57) ABSTRACT

A method for filtering an electrical signal. The invention includes the steps of rotating a conductive disc (105) about an axis (135), applying a magnetic field (205) to the conductive disc (105) in a direction that is generally parallel to the axis of rotation (135), electrically connecting a first and second conductor (215, 220) to the disc (105) at radially spaced locations thereon, and connecting the first and second conductors (215, 220) in at least one of a series and parallel configuration. The conductive disc (105) can be formed in a recess (130) in a substrate (125) which can have a printed circuit or an integrated circuit. The substrate (125) can consist of a semiconductor or ceramic, such as a low temperature co-fired ceramic. The first and second conductors (215, 220) and the conductive disc (105) rotating in the magnetic field (205) can define an electro-mechanical capacitor (100), which can be used for capacitively filtering a signal. An inductor also can be provided.

23 Claims, 8 Drawing Sheets

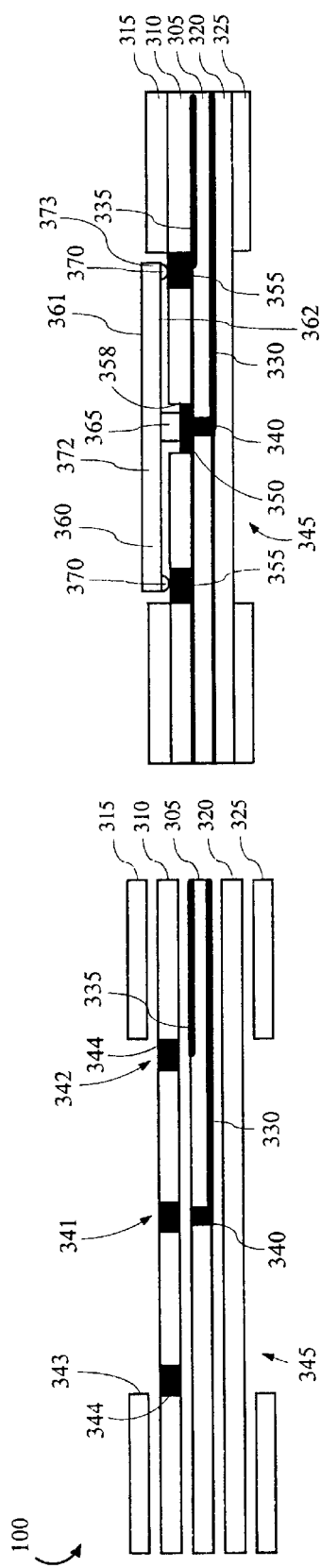
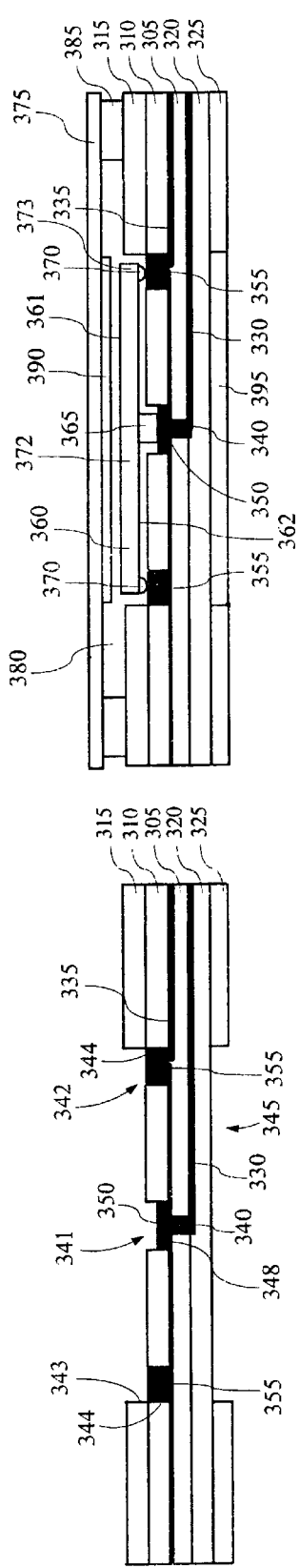
FIG. 3A
FIG. 3B
FIG. 3C
FIG. 3D

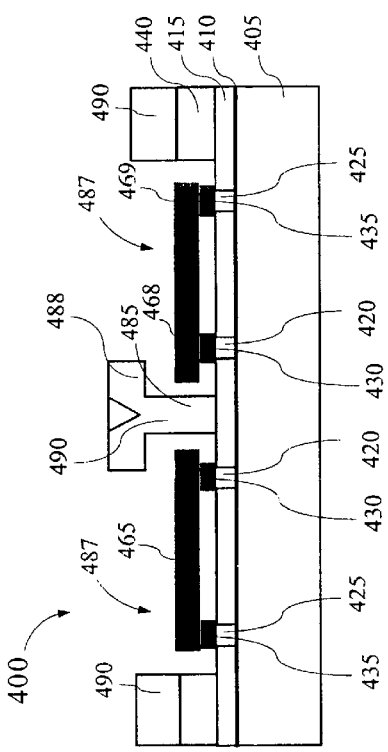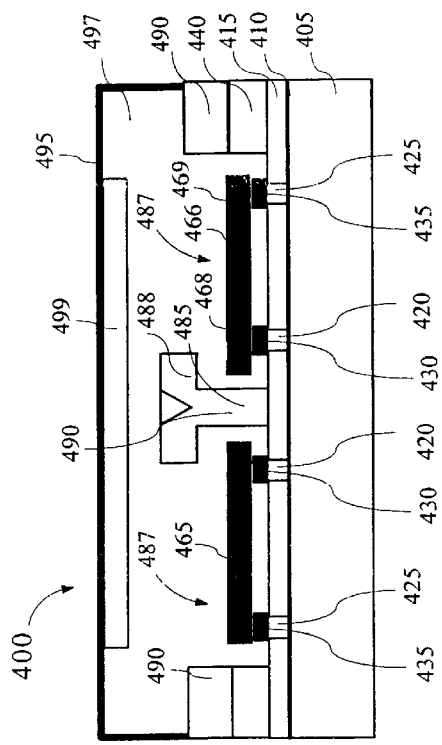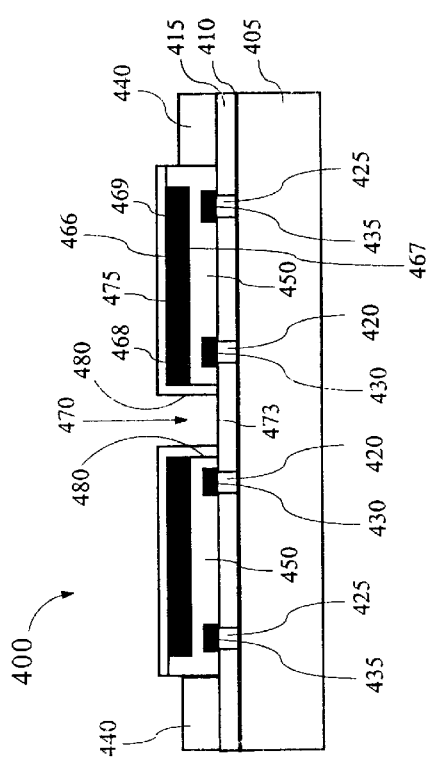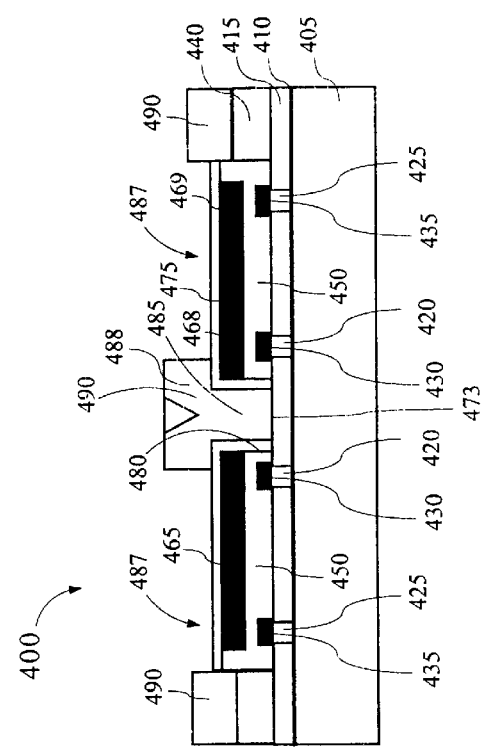
FIG. 4E
FIG. 4F
FIG. 4G
FIG. 4H

FILTER CIRCUIT INCORPORATING A MICRO-ELECTROMECHANICAL CAPACITOR

BACKGROUND OF THE INVENTION

1. Statement of the Technical Field

The inventive arrangements relate generally to the field of capacitors, and more particularly to capacitors incorporated onto substrate materials.

2. Description of the Related Art

Physical dimensions continue to shrink and frequencies continue to increase in modern electronic circuits. Notably, there is a strong demand for smaller, lighter, and higher performance electronic devices. Several factors currently limit the extent to which the size and weight of electronic devices can be reduced and the performance can be increased. In particular, the relatively low energy storage density of conventional capacitors is a limiting factor.

Electrical characteristics of conventional capacitors, such as dissipation factor (DF), equivalent series resistance (ESR), leakage resistance, equivalent series inductance (ESL), dielectric absorption, and dielectric breakdown, are limiting factors to filter performance as well. For example, DF, ESR, ESL, and dielectric absorption each negatively effect a capacitors ability to pass or shunt RF signals with minimum attenuation and distortion.

Moreover, it is well known that conventional capacitors are prone to failure due to dielectric breakdown when the capacitors are exposed to an electromagnetic pulse (EMP) or high energy voltage spikes. This flaw is of particular concern when a capacitor is being used in a mission critical system, such as a power supply in a satellite or an aircraft, or an RF filter in military hardware or a secure facility. Accordingly, there exists a need for a high performance capacitor that provides high energy density and good RF performance, and that is rugged enough to withstand EMP's and voltage spikes that are of concern in high reliability environments.

SUMMARY OF THE INVENTION

The present invention relates to a method for filtering an electrical signal. The invention includes the steps of rotating a conductive disc about an axis, applying a magnetic field to the conductive disc in a direction that is generally parallel to the axis of rotation, electrically connecting a first and second conductor to the disc at radially spaced locations thereon, and connecting the first and second conductors in at least one of a series and parallel configuration. The conductive disc can be formed in a recess in a substrate, which can have a printed circuit or an integrated circuit. The substrate can consist of a semiconductor or ceramic, such as a low temperature co-fired ceramic.

Notably, the first and second conductors and the conductive disc rotating in the magnetic field can define an electromechanical capacitor, which can be used for capacitively filtering a signal. Further, the first and second conductors can be connected to an inductor in a series or a parallel configuration to form a filter circuit, for example a low pass filter circuit, a band pass filter circuit, and high pass filter circuit, and band notch filter circuit and an all pass filter circuit. Moreover, a second electro-mechanical capacitor can be connected to the first electro-mechanical capacitor in a series or parallel configuration to control a filter response. Importantly, the intensity of the magnetic field can be varied in response to a control signal to produce a desired filter response for filtering a signal. Further, the thickness or mass density of the conductive disc also can be selected to produce a desired filter response.

BRIEF DESCRIPTION OF THE DRAWINGS

FIGS. 3A–3D illustrate an exemplary process for manufacturing the micro-electromechanical capacitor on a ceramic substrate in accordance with the present invention.

FIGS. 4A–4H illustrate an exemplary process for manufacturing the micro-electromechanical capacitor on a semiconductor substrate in accordance with the present invention.

DETAILED DESCRIPTION OF THE PREFERRED EMBODIMENTS

The present invention relates to a micro-electromechanical capacitor (MEC), which can be, for example, a micro-electromechanical homopolar generator (MEHG) manufactured on a substrate. Notably, the MEC is an energy storage device that can be used in place of a capacitor in a variety of applications, for example to provide filtering of electric signals. The MEC also can be used as a compact current source, thereby eliminating the need for large capacitors that are commonly used to supplement a power supply during peak current demand. Such capacitors are generally too large to be incorporated into an integrated circuit (IC) package, having energy storage densities on the order of 0.1 mJ/mm$^3$. By comparison, the MEC can provide a typical energy storage density on the order of 10 mJ/mm$^3$, and in some instances on the order of 1 J/mm$^3$. Accordingly, the present invention provides the circuit designer with an added level of flexibility by permitting the incorporation of an MEC into a circuit board substrate or an IC package. This added flexibility enables improved circuit performance and circuit density not otherwise possible.

Figure 1:
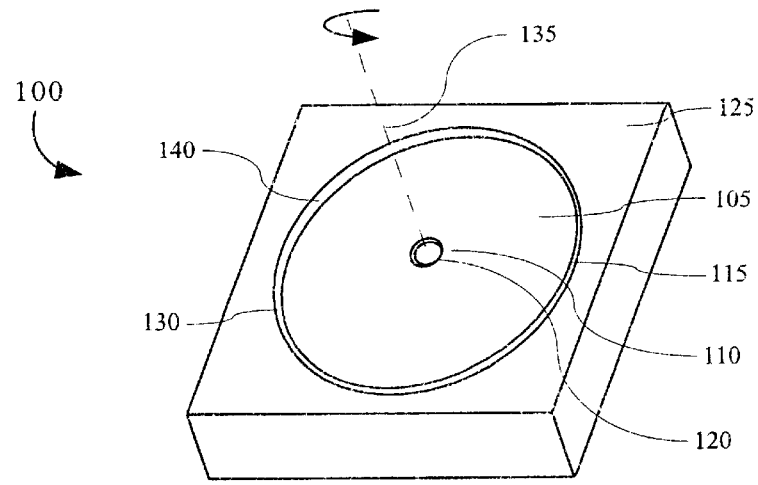
FIG. 1 is a perspective view of an exemplary micromechanical capacitor in accordance with the present invention.

An exemplary MEC is shown in FIG. 1. The MEC 100 includes a conductive disc (disc) 105, or rotor, having a central portion 110 and radial edge 115. The disc 105 can be positioned proximate to a substrate surface, for example within an aperture 130 formed within a substrate 125. In one arrangement, the disc 105 can be provided with an axel 120 to facilitate rotation about a central axis 135 of the disc 105 and maintain the disc 105 in the proper operating position. But other arrangements can be provided as well. For example, in another arrangement the aperture 130 can be structured with a low friction peripheral surface 140 that maintains the disc 105 within the aperture 130. In yet another arrangement a hole can be provided at the central axis 135 of the disc 105. The hole can fit over a cylindrical structure, such as a bearing, to maintain the operating position of the disc 105.

Figure 2:
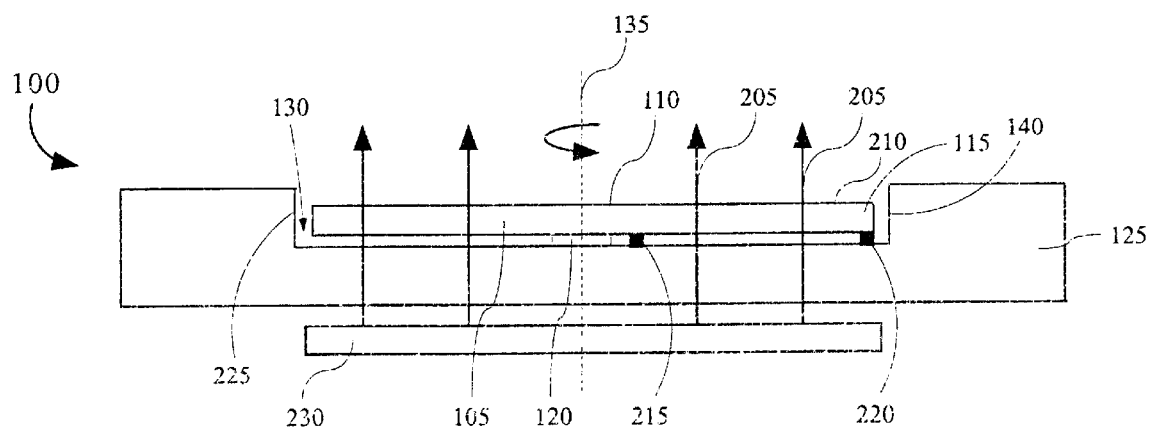
FIG. 2 is a side view of the exemplary micro-mechanical capacitor in accordance with the present invention.

Referring to FIG. 2, the rotatable conductive disc 105 is immersed in a magnetic field, illustrated with magnetic field lines 205, which are typically perpendicular to a surface 210 of the disc 105. One or more magnets 230 can be provided above and/or below the conductive disc 105 to generate the magnetic field. The magnets 230 can include permanent magnets and/or electromagnets. A first contact brush 215 can contact the disc near its central portion 110, which is proximate to the disc axis of rotation 135. A second contact brush 220, which is radially spaced from the first contact brush 215, can contact the radial edge 115 of the disc 105. In one arrangement, a contact brush (not shown) can be provided to contact the axel 120. Additional contact brushes also can be provided. For example, contact brushes can be spaced in a circular pattern to contact multiple points on the radial edge 115. Likewise, contact brushes can be spaced near the central portion 110 of the disc 105 to contact the central portion 110 at multiple points or to contact the axel 120 at multiple points.

When voltage is applied across the contact brushes 215 and 220, causing current to flow through the disc 105, magnetic forces are exerted on the moving charges. The moving charges in turn exert the force to the disc 105, thereby causing the disc 105 to rotate and store kinetic energy. When the voltage source is replaced with an electrical load, the kinetic energy stored in the rotating disc 105 can be used to generate electricity. As the conductive disc 105 rotates within the magnetic field, an electromotive force (emf) is induced in the disc 105, thereby causing current flow through a load, such as a circuit device.

The amount of voltage ($V_t$) that is generated by the MEC 100 is approximately given by the formula $$V_t = \frac{\omega_m B (r_2^2 - r_1^2)}{2},$$

where $\Omega_m$ is angular velocity of disc, B is the flux density of the magnetic field that is perpendicular to the motor, $r_1$ is the radial distance between the center of the disc 105 and the first contact brush 215, and $r_2$ is the radial distance between the center of the disc 105 and the second contact brush 220. The impedance (Z) of the MEC is given by the formula $$Z = \frac{B^2}{2\pi t \rho} \frac{1}{j\omega}$$

and the equivalent capacitance (C) is given by $$C = \frac{2\pi t \rho}{B^2},$$

where t is the thickness of the rotor, and p is the mass density of the rotor material. Further, the time constant (t) for charging the MEC 100 is proportional to $$\frac{\rho}{B^2}.$$

Accordingly, the flux density of the magnetic field can be varied to adjust the charge time, output current, impedance, and equivalent capacitance of the MEC 100. For example, if an electromagnet is provided to generate at least a portion of the magnetic field, the current in the electromagnet can be adjusted to adjust the flux density. In particular, reducing current flowing through the conductor of an electromagnet can reduce the magnetic flux density and increasing the current flowing through the conductor of the electromagnet can increase the magnetic flux density. Any of a myriad of devices can be used as a controller to vary the current flowing through the conductor of the electromagnet, for example, an amplifier circuit, a rheostat, a potentiometer, a variable resistor, or any other device having an adjustable output current or voltage.

Importantly, the MEC 100 has a lower equivalent series resistance (ESR) and a lower equivalent series inductance (ESL) than a conventional capacitor. The lower ESR is due to the entire disc 105 being the primary conductor in the MEC 100. Notably, the disc 105 has a greater cross sectional area than conductor leads or plates of a conventional capacitor. The lower ESL results from the MEC 100 having shorter conductor leads and better lead geometry than a conventional capacitor. Both of these characteristics are desirable capacitor features. The lower ESR gives the MEC 100 a lower dissipation factor (DF), which is proportional to the ESR, and a higher quality factor (Q), which is inversely proportional to ESR. Further, the MEC 100 has lower dielectric absorption (DA) than a conventional capacitor, which is also a desirable feature, because the energy in the MEC 100 is stored as kinetic energy in a rotating disc. In a conventional capacitor, on the other hand, energy is stored in an electric field within a dielectric. Some of this energy tends to be absorbed by the dielectric material itself when an electric field is applied, and the absorbed energy is slowly discharged after the initial electric field is collapsed.

Low ESL, low DF, high Q and low DA each contribute to better capacitor performance, as is known to those skilled in the art of capacitor design. For example, a capacitor with lower ESL, DF, or DA, or higher Q, will exhibit lower signal attenuation and less signal distortion than an otherwise equivalent capacitor. Hence, the MEC 100 provides a better signal transfer than a conventional capacitor. Accordingly, the use of the MEC 100 in lieu of a conventional capacitor improves circuit performance.

The MEC 100 can be manufactured on a variety of substrates, for example, ceramic, silicon, gallium arsenide, gallium nitride, germanium, indium phosphide, and any other substrate material suitable for a microelectromechanical manufacturing process. FIGS. 3A–3D represent an exemplary manufacturing process for manufacturing the MEC 100 on a ceramic substrate. The ceramic substrate can be made of any suitable ceramic substrate material, for example low temperature co-fired ceramic (LTCC) material. One such LTCC material is Green Tape™ provided by DuPont, 14 NW Alexander Drive, Research Triangle Park, N.C. 27709.

Referring to FIG. 3A, a first ceramic substrate layer 305 can be provided. The ceramic substrate material that is to be used in each of the ceramic substrate layers can be preconditioned before being used in a fabrication process. For example, the ceramic material can be baked at an appropriate temperature for a specified period of time or left to stand in a nitrogen dry box for a specified period of time. Common preconditioning cycles are 120° C. for 20–30 minutes or 24 hours in a nitrogen dry box. Both preconditioning process are well known in the art of ceramic substrates.

Once the first ceramic substrate layer (first ceramic layer) 305 is preconditioned, a conductive via 340 can be formed in the first ceramic layer 305 to provide electrical conductivity through the ceramic layer. Many techniques are available for forming conductive vias in a ceramic substrate. For example, vias can be formed by mechanically punching holes or laser cutting holes into the ceramic substrate. The holes then can be filled with a conductive material, such as a conventional thick film screen printer or extrusion via filler. Vacuum can be applied to the first ceramic layer through a porous stone to aid via filling. Once the conductive via 340 has been formed in the first ceramic layer 305, the conductive material can be dried in a box oven at an appropriate temperature and for an appropriate amount of time. For example, a common drying process is to bake the ceramic substrate having the conductive material at 120° C. for 5 minutes.

After the conductive filler in the via has dried, a first conductive circuit trace 330 and a second conductive circuit trace 335 can be provided. The circuit traces 330 and 335 can be deposited onto the first ceramic layer 305 using a conventional thick film screen printer, for example, standard emulsion thick film screens. In one arrangement the circuit traces 330 and 335 can be deposited onto opposite sides of the first ceramic layer 305, with the first circuit trace 330 being in electrical contact with the conductive via 340. The second circuit trace 335 can extend around, and concentric with, the conductive via 340. Nonetheless, a myriad of other circuit layouts can be provided, as would be known to the skilled artisan. As with the via filling process, once the circuit traces have been applied to the first ceramic layer 305, the circuit traces can be dried in a box oven at an appropriate temperature and for an appropriate amount of time.

Subsequent ceramic substrate layers can be laminated to the first ceramic layer 305 after appropriate preconditioning and drying of the circuit traces and/or via fillers. In particular, a second ceramic substrate layer (second ceramic layer) 310 can be stacked onto the first ceramic layer 305. The second ceramic layer 310 can insulate circuit traces on the top of the first ceramic layer 305. The second ceramic layer also can include vias 341 and 342, which can be filled with material to form an axial contact brush 350 and at least one radial contact brush 355, respectively. The vias can be positioned so that the contact brushes make electrical contact with respective circuit traces 330 and 335. In one arrangement, a plurality of radial contact brushes 355 or a continuous radial edge contact brush can be disposed concentric with, and at a uniform radius from, the axial contact brush 350 to reduce a net contact resistance between the a conductive object and the brushes.

The contact brushes can include any conductive material suitable for use in a contact brush, for example a carbon nano composite or a conductive liquid. In the case that the contact brushes are a solid material, such as carbon nano composite, the contact brushes can be screen printed into the vias in the second ceramic layer 310 using a conventional thick film screen printer. In the case that a conductive liquid is used as contact brushes, ferromagnetic properties can be incorporated into the conductive liquid so that a magnetic field can contain the conductive liquid within the vias 341 and 342. In one arrangement, the axial contact brush 350 can fill only part of the via 341 so that a top surface of the via is disposed below a top surface of the second layer 310. Accordingly, the via 341 also can function as a bearing.

A third ceramic substrate layer (third ceramic layer) 315 can be stacked above the second ceramic layer 310. The third ceramic layer 315 can incorporate an aperture having a radius edge 343 aligned with an outer radius of vias 342 (a portion of each via furthest from the via 341). A fourth ceramic substrate layer (fourth ceramic layer) 320 can be stacked below the first ceramic layer 305 to insulate circuit traces on the bottom of the first ceramic layer 305. Lastly, a fifth ceramic substrate layer (fifth ceramic layer) 325 can be stacked below the fourth ceramic layer 320. As with the third ceramic layer, the fifth ceramic layer also can include an aperture 345 having a radius aligned with the outer radius of vias 342.

Once the ceramic substrate layers have been stacked to form the substrate structure shown in FIG. 3B, the structure can be laminated using a variety of lamination methods. In one method, the ceramic substrate layers can be stacked and hydraulically pressed with heated platens. For example, a uniaxial lamination method presses the ceramic substrate layers together at 3000 psi for 10 minutes using plates heated to 70° C. The ceramic substrate layers can be rotated 180° following the first 5 minutes. In an isotatic lamination process, the ceramic substrate layers are vacuum sealed in a plastic bag and then pressed using heated water. The time, temperature and pressure can be the same as those used in the uniaxial lamination process, however, rotation after 5 minutes is not required. Once laminated, the structure can be fired inside a kiln on a flat tile. For example, the ceramic substrate layers can be baked between 200° C. and 500° C. for one hour and a peak temperature between 850° and 875° can be applied for greater than 15 minutes. After the firing process, post fire operations can be performed on the ceramic substrate layers.

Referring to FIG. 3C, a conductive disc (disc) 360 having an upper surface 361 and an opposing lower surface 362 can be provided in the MEC for use as a rotor for storing kinetic energy. In one arrangement, a plurality of conductive discs can be provided to achieve greater energy storage capacity. The disc 360 can include a central contact 365 axially located on the lower surface 362, and at least one radial contact 370, also located on the lower surface 362. In one arrangement, the radial contact 370 can extend around the lower peripheral region 373 of the disc 360. The disc 360 can be positioned above the second ceramic substrate layer 310 so that the central contact 365 makes electrical contact with the axial contact brush 350 and the radial contact 370 makes electrical contact with the radial edge contact brush 355. Accordingly, electrical current can flow between an inner portion 372 of the disc 360 and the peripheral region 373 when voltage is applied across the contact brushes 350 and 355. The radial wall 358 of the aperture 341 can function as a bearing surface for the central contact 365 of the disc 360. Alternatively, bearings (not shown) can be installed between the radial wall 358 and the central contact 365. The bearings can be, for example, electromagnetic or electrostatic bearings.

Referring to FIG. 3D, a lid 375 can be provided above the disc 360 to provide an enclosed region 380 in which the disc 360 can rotate. Dust and other contaminants that enter the enclosed region 380 can increase friction between the contacts 365 and 370 and the contact brushes 350 and 355, which can reduce the efficiency of the MEC. To reduce contamination, a seal layer 385 can be provided between the third ceramic layer 315 and the lid 375 to form a continuous seal around a periphery of the disc 360.

One or more magnets can be fixed above and/or below the disc 360 to provide a magnetic field aligned with an axis of rotation 135 of the disc 360. For example a magnet 390 can be attached to the bottom of the lid 375, spaced from the upper surface of the disc 361. A magnet 395 also can be spaced from the lower surface 362 of the disc 360. For example, a magnet can be provided beneath the fourth ceramic substrate layer 320, within the aperture 345 of the fifth ceramic substrate layer 325. The magnets 390 and 395 can be permanent magnets, such as magnets formed of magnetic material. For example, the magnets 390 and 395 can be made of ferrite, neodymium, alnico, ceramic, and/or any other material that can be used to generate a magnetic field.

The magnets 390 and 395 also can be non-permanent magnets, for example, electromagnets. In another arrangement, the magnets can be a combination of permanent magnets and non-permanent magnets, for example, an electromagnet adjacent to one or more layers of magnetic material. As previously noted, the strength of the magnetic field generated by an electromagnet can be varied by varying the current through the conductor of the electromagnet, which can be useful for varying the output current of the MEC, also as previously noted.

In another exemplary embodiment, the MEC 100 can be manufactured on a semiconductor substrate, for example on a silicon substrate using a polysilicon microfabrication process. Polysilicon microfabrication is well known in the art of micromachining. One such process is disclosed in David A. Koester et al., *MUMPs Design Handbook* (Rev. 7.0, 2001). An exemplary polysilicon microfabrication process is shown in FIGS. 4A–4H. It should be noted, however, that the invention is not limited to the process disclosed herein and that other semiconductor microfabrication processes can be used.

Importantly, the MEC 100 can be fabricated on a substrate of a printed circuit, for example a printed circuit board having printed circuit traces, or on a substrate of an integrated circuit, for example central processing unit (CPU). Importantly, the MEC 100 can provide a built-in current source or signal filter. The need for external energy storage or filter capacitors can be thereby eliminated. For example, modern computer systems commonly include a bank of energy storage capacitors immediately next to a central processing unit (CPU). Using the MEC, energy storage capacity and filtering can be fabricated into the CPU chip itself. Further, the MEC can be incorporated into digital signal processors (DSPs), or any other type of integrated circuit. In the case that varying magnetic field strength is desired, the controller controlling the magnetic flux density also can be integrated into the IC. Moreover, other circuits requiring on-chip energy storage capacity or filtering can be compactly fabricated onto a single IC chip as well.

Figure 4C:
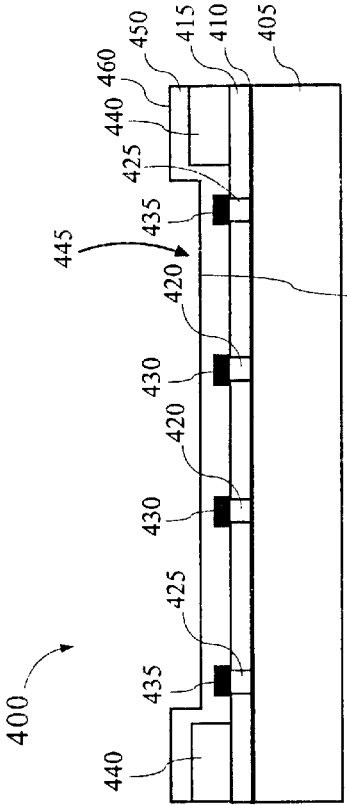
Figure 4D:
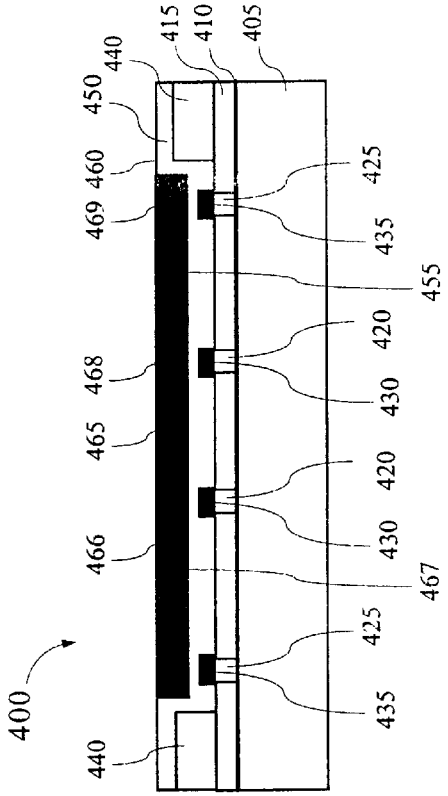
Figure 4A:
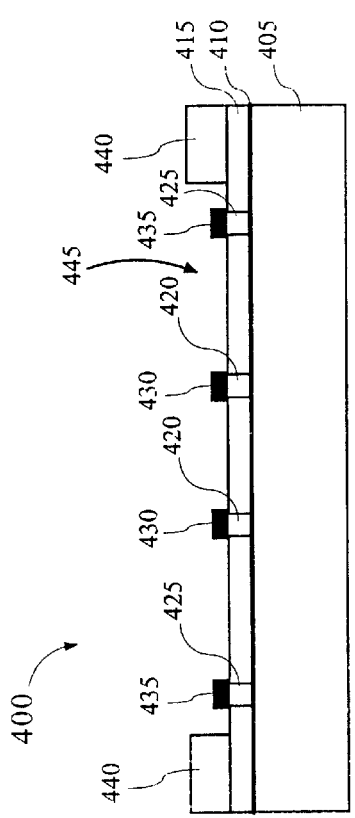

Referring to FIG. 4A, a first silicon substrate layer (first silicon layer) 405 can be provided to begin forming the MEC structure 400, for example, a silicon wafer typically used in IC manufacturing. It may be desirable for the first silicon layer 405 to have electrically insulating properties. Accordingly, the first silicon layer 405 can be formed without doping or have only a light doping. Alternatively, an electrically insulating layer can be applied over the first silicon layer 405. For example, a layer of silicon dioxide can be applied over the first silicon layer 405. Notwithstanding, a conductive layer can be deposited onto the substrate. For example, a conductive layer of doped polysilicon or aluminum can be deposited onto the substrate. After deposition of the conductive layer, conductive circuit traces 410 can be defined using known lithography and etching techniques.

After the circuit traces are formed, an electrically insulating layer 415, such as silicon nitride (SiN), can be deposited over the first substrate and circuit traces. For example, low pressure chemical vapor deposition (LPCVD) involving the reaction of dichlorosilane ($SiH_2Cl_2$) and ammonia ($NH_3$) can be used to deposit an insulating layer. A typical thickness for the SiN layer is approximately 600 nm.

Inner vias 420 and outer vias 425 then can be formed through the insulating layer 415 and filled with electrically conductive material (e.g. aluminum) to electrically contact the circuit traces 410 at desired locations. Axial contact brushes 430 then can be deposited on inner vias 420 and radial edge contact brushes 435 can be deposited on outer vias 425 so that the contact brushes 430 and 435 can be electrically continuous with the respective vias 420 and 425. Accordingly, the electrical contact brushes are electrically continuous with respective ones of circuit traces 410. Two axial contact brushes 430 and two radial edge contact brushes 435 are shown in the figure, but additional axial and radial edge contact brushes can be provided. Further, the contact brushes can include any conductive material suitable for use in a contact brush, for example a carbon nano composite, which can be applied using a thermo spray method commonly known to the skilled artisan. In another arrangement the contact brushes can be a conductive liquid.

A first structural layer of polysilicon (poly 1) 440 can be deposited onto the insulating layer 415 using LPCVD. The poly 1 layer then can be etched to form a radial aperture 445 which exposes the contact brushes 430 and 435. In an alternate arrangement, the aperture 445 region can be masked prior to application of the poly 1 layer 440, thereby preventing deposition in the aperture 445 region.

Figure 4B:
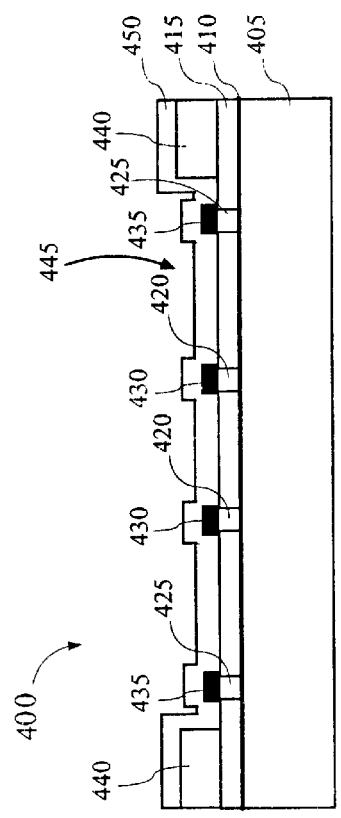

Referring to FIG. 4B, a first sacrificial layer 450, for example silicon dioxide ($SiO_2$) or phosphosilicate glass (PSG), can be applied to the substrate over the previously applied layers. The first sacrificial layer 450 is removed at the end of the process, as is further discussed below. The sacrificial layer can be deposited by LPCVD and annealed to the circuit. For example, in the case that PSG is used for the sacrificial layer, the sacrificial layer can be annealed at 1050° C. in argon. The first sacrificial layer 450 then can be planarized within the aperture 445 using a planarizing etch-back process to form a flat base 455 within the aperture 445 that is recessed from an upper elevation 460 of the first sacrificial layer, as shown in FIG. 4C.

Referring to FIG. 4D, a conductor then can be deposited into the aperture 445 to form a conductive disc (disc) 465 having opposing upper surface 466, a lower surface 467, an inner region 468, and a peripheral region 469. Further, the disc 465 can be wholly contained within the aperture 445 so that the only material contacting the conductive disc 465 is the sacrificial layer. The thickness of the disc 465 can be determined by the thickness of the first sacrificial layer 450 and the amount of etch-back. Importantly, the equivalent capacitance of MEC is proportional to thickness of disc 465. Accordingly, the thickness of the disc 465 can be selected to achieve a desired equivalent capacitance. Further, mechanical characteristics, such as rigidity, should be considered when selecting a thickness for the disc 465.

A second aperture 470 then can be etched through the inner region 468 of the disc 465 and through the first sacrificial layer below the center of the disc to expose the second silicon substrate layer 415, as shown in FIG. 4E. Notably, the second aperture 470 can be sized to form a hole in the disc 465 having a radius equal to or smaller than the radial distance between opposing axial contact brushes 430 and 435. Further, the first sacrificial layer in contact with the SiN layer 415 also can be etched away to expose a region 473 of the SiN layer 415 within the second aperture 470. Known etching techniques can be used, for example reactive ion etch (RIE), plasma etching, etc.

A second sacrificial layer 475, for example $SiO_2$ or PSG, then can be applied over an upper surface of the disc 465 and over the radial wall 480 formed by the second aperture 470. Importantly, the region 473 of the SiN layer 415 should be masked during the application of the second sacrificial layer 475 to prevent the second sacrificial layer 475 from adhering to the SiN layer in the region 473. Alternatively, a subsequent etching process can be performed to clear away the second sacrificial layer from the region 473.

Referring to FIG. 4F, using LPCVD, a second layer of polysilcon (poly 2) 490 can be deposited over the previously applied layers, for example the poly 1 layer 440 surrounding the disc 465, thereby adding an additional silicon structure. Notably, the poly 2 layer 490 also can fill the second aperture 470. A washer shaped region 487 then can be etched to remove a washer shaped portion of the poly 2 layer 490 located above the disc 465. Notably, the inner radius of the washer shaped region 487 can be larger than the inner radius of the disc 465. Accordingly, the etching of the poly 2 layer 490 can leave a structure 485, having a "T" shaped cross section, within the second aperture 470. An upper portion 488 of the structure 485 can extend over the inner portion 468 of disc 465, thereby limiting vertical movement of the disc 465 once the sacrificial layers are removed. Further, the structure 485 can operate as a bearing around which the disc 465 can rotate. Alternatively, electromagnetic or electrostatic bearings can be provided in the second aperture 470.

Referring to FIG. 4G, the first and second sacrificial layers 450 and 475 then can be released with a hydrogen fluoride (HF) solution as is known to the skilled artisan. For example, the MEC structure 400 can be dipped in an HF bath. HF does not attack silicon or polysilicon, but quickly etches $SiO_2$. Notably, the HF can etch deposited $SiO_2$ approximately 100× faster than SiN. The release of the sacrificial layers 450 and 475 enables the disc 465 to rest upon, and make electrical contact with, the axial and radial edge contact brushes 430 and 435. Moreover, the release of the sacrificial layers 450 and 475 frees the disc 465 to rotate about its axis.

A lid 495 can be provided above the disc 465 to provide an enclosed region 497 in which the disc 475 can rotate, as shown in FIG. 4H. As previously noted, dust and other contaminants that enter the enclosed region 497 can reduce the efficiency of the MEC. A magnet 499 can be fixed above and/or below the disc 465 to provide a magnetic field aligned with the axis of rotation of the disc 465. For example a magnet can be attached to the bottom of the lid 495, spaced from the upper surface 466 of the disc 465. Further, a magnet can be attached to the bottom of the first silicon substrate below the disc 465, for example with a third silicon substrate layer.

As previously noted, the magnet 499 can be a permanent magnet, non-permanent magnet, or a combination of a permanent magnet and a non-permanent magnet. For example, the magnet can include an electromagnet and one or more layers of magnetic material. The strength of the magnetic field generated by an electromagnet can be varied by varying the current through the conductor of the electromagnet, which can be useful for varying the output current of the MEC, also as previously noted. In operation, a voltage applied across axial contact brush 430 and radial edge contact brush 435 causes current to flow between a region near the inner radius 472 of the disc 465 and a peripheral region 469 of the disc 465, thereby causing the disc to rotate, as previously described.

Exemplary circuits in which the MEC can be used are shown in FIGS. 5A–5K. Notably, the MEC can be used in any type of circuit that requires a capacitance value. Accordingly, it will be understood that the present invention is not limited to these examples.

Figure 5A:
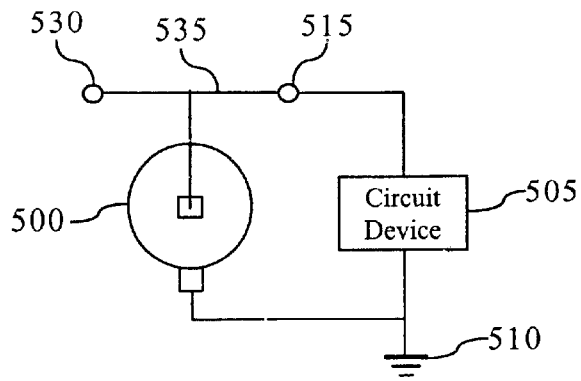
FIGS. 5A–5K are an exemplary filter circuits incorporating micro-mechanical capacitors in accordance with the present invention.

Referring to FIG. 5A, an exemplary circuit 550 is presented wherein the MEC 500 is connected in parallel to a circuit device 505. For example, the MEC 500 can be connected between the input port 515 of the circuit device and a ground connection 510, which can be a grounded conductor, a ground plane, or a return wire. If the input port 515 is a power input to the circuit device 505, the MEC 500 can store energy from a power supply connected to circuit input port 530 and provide the stored energy to the circuit device 505 during peak power demands. Further, the impedance of the MEC 500 is inversely proportional to frequency. Accordingly, the MEC 500 can be used as a filter to shunt to ground 510 high frequency noise, signals and pulses propagating on a conductor 535, which is connected to the input port 515, while low frequency signals are transferred to the circuit device 505.

Figure 5B:
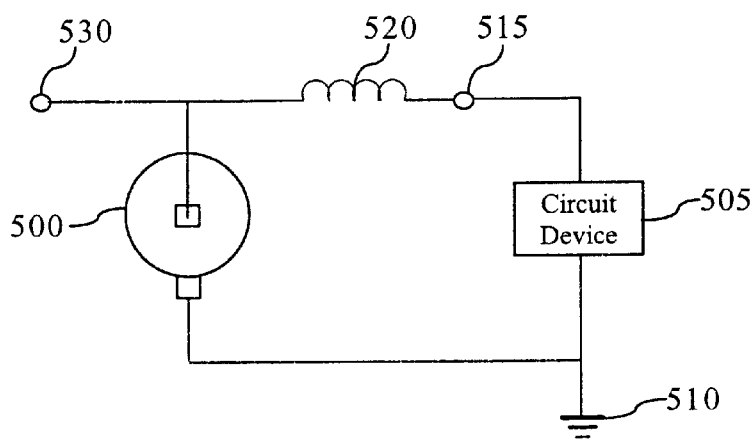
Figure 5C:
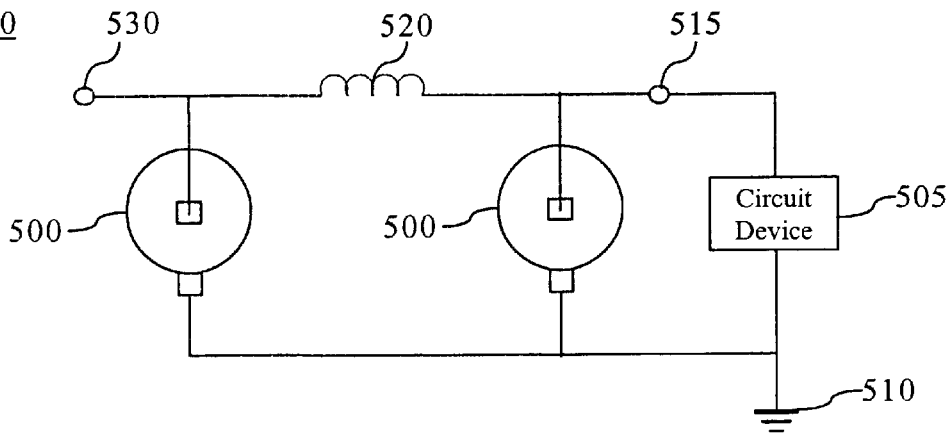
Figure 5D:
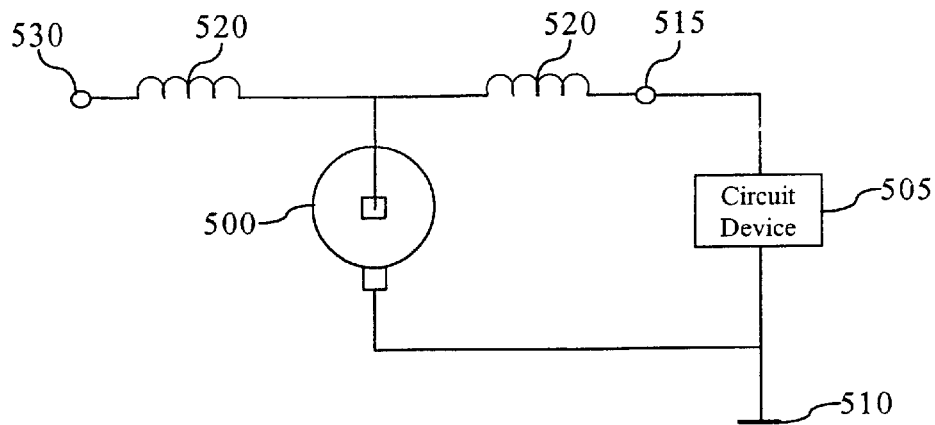

One or more inductors 520 can be provided in series with the circuit device 505, as shown in a low pass "L" filter circuit 555 of FIG. 5B. Additional MECs also can be provided for increased filter performance. For example, an inductor 520 and multiple MECs 500 can be arranged in a low pass "π" filter as shown in circuit 560 of FIG. 5C. Further, circuit 565 of FIG. 5D provides an example of a low pass "T" filter circuit incorporating an MEC 500.

Figure 5E:
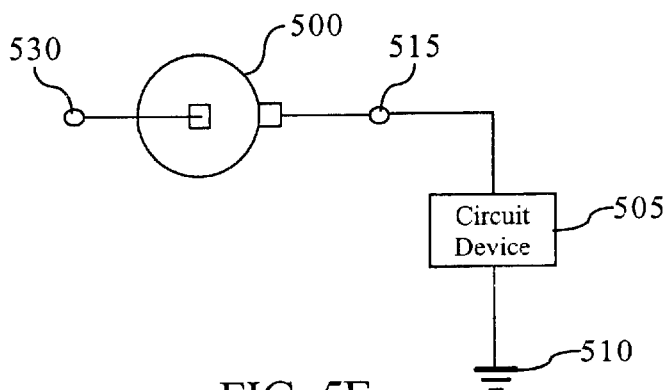
Figure 5F:
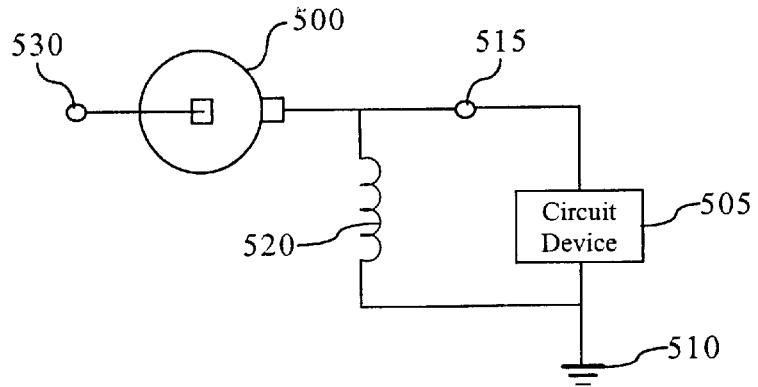
Figure 5G:
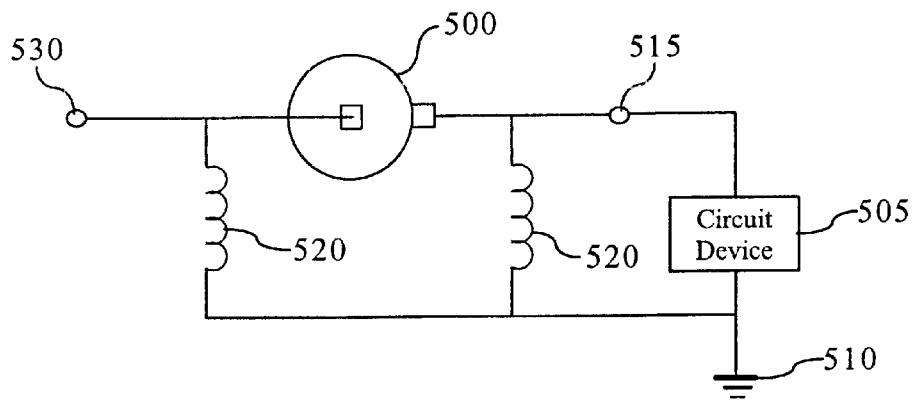
Figure 5H:
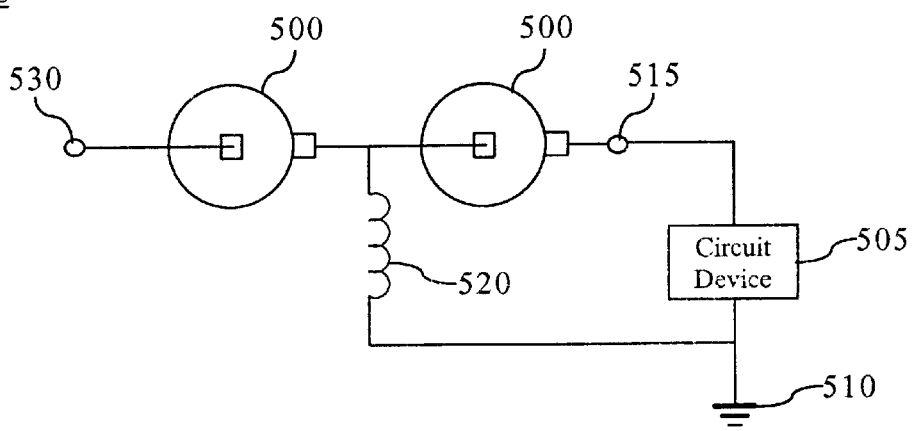

Referring to FIG. 5E, an exemplary circuit 570 is presented wherein the MEC 500 is connected in series to a circuit device 505. In particular, the MEC 500 can be connected between the input port 530 of the circuit and the input port 515 of the circuit device 505. Since the impedance of the MEC 500 is inversely proportional to frequency, the MEC 500 passes high frequency signals to the circuit device 505. Conversely, the MEC 500 presents a high impedance for low frequency signals, noise and pulses, which are attenuated accordingly. Hence, this configuration can be referred to as a high pass filter. In a further arrangement, one or more inductors 520 can be provided as shunt elements, for example as shown in the high pass "L" filter circuit 575 in FIG. 5F. Further, a high pass filter having a "π" configuration is shown in a circuit 580 of FIG. 5G and a high pass filter having a "T" configuration is shown in a circuit 585 in FIG. 5H.

Figure 5I:
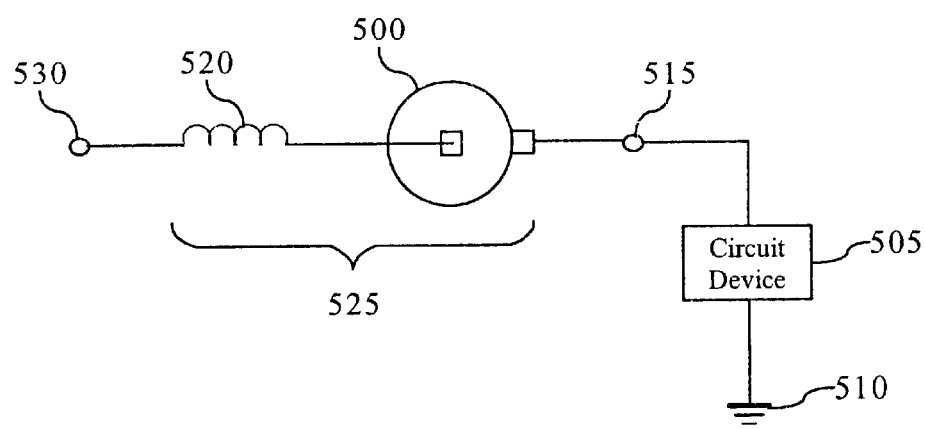

Additionally, the MEC 500 can be incorporated into other types of filter circuits, for example a band pass filter circuit 590 as shown in FIG. 5I. In this configuration, the MEC 500 can be connected in series with an inductor 520 to form a series resonant circuit 525 in the bandpass filter circuit. The series resonant circuit 525 can be connected in series with the circuit device 505, as shown, or in parallel with the circuit device 505 (not shown). In the series arrangement, the filter section 525 will exhibit minimum insertion loss at the frequency at which the inductor 520 and the MEC 500 resonate, which is given by the formula $$\omega = \sqrt{\frac{B^2}{2\pi t\rho L}},$$

where L is the value of the inductor 520. The filter section 525 will have higher insertion loss at frequencies above and below the resonant frequency. If the series resonant circuit 525 is connected in parallel with the circuit device, the series resonant circuit operates as a band notch filter. In a band notch filter, the filter section 525 will exhibit maximum insertion loss at the resonant frequency of the MEC 500 and the inductor 520 and lower insertion loss at frequencies above and below the resonant frequency.

Figure 5J:
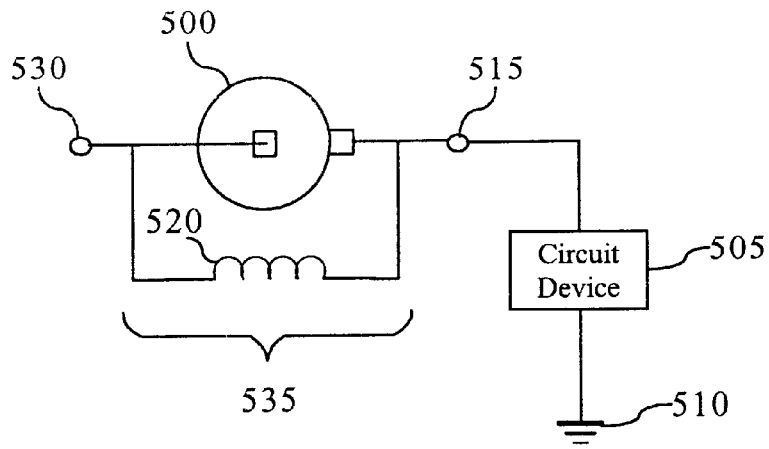

Another band notch filter arrangement is shown in circuit 595 of FIG. 5J. In this arrangement, the MEC 500 and the inductor 520 can be connected in parallel to form a parallel resonant circuit 535. The parallel resonant 535 can be connected in series with the circuit device 505, as shown. In this arrangement, the resonant frequency is also determined by the formula $$\omega = \sqrt{\frac{B^2}{2\pi t\rho L}}.$$

The parallel resonant circuit 535 also can be connected in parallel with the circuit device 505 to form a band pass filter (not shown).

Figure 5K:
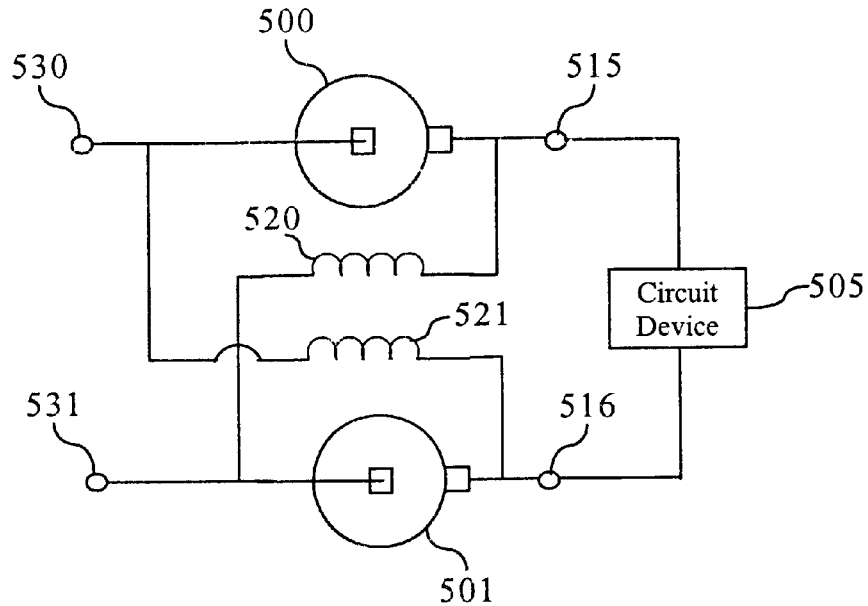

Lastly, an exemplary all pass filter circuit 598 incorporating MECs 500 is shown in FIG. 5K. Such a circuit typically includes two circuit input ports 530, 531 and two circuit device input ports, 515, 516. In the example the MECs 520, 521 are shown in series with the circuit device's input ports 515, 516, but the invention is not so limited. For example, the relative positions of the MECs 500, 501 can be swapped with inductors 520, 521. In the swapped arrangement, inductors 520, 521 can be connected in series with the circuit device input ports 515, 516, while a first MEC 520 is connected between circuit input port 530 and device input port 516, and a second MEC 521 is connected between circuit input port 531 and device input port 515. Still, numerous other all pass filter configurations incorporating MECs can be provided.

The filter examples presented herein are simplistic in nature. Importantly, multiple filter sections and resonant circuits can be cascaded to construct n order filter circuits, where n is any integer. Such filter topographies are well known to those skilled in the art of electric filters (e.g. RF filters). Further, other electrical components can be combined with the MECs to form more complex circuits. For example, resistors, diodes, integrated circuits, and/or any other electrical devices that can operate in circuits having capacitors. Notably, the circuit components, such as the inductor, can be formed in the same substrate as the MEC or mounted to the substrate.

As previously noted, the flux density of the magnetic field in the MEC 500 can be varied to adjust the equivalent capacitance of the MEC 500. Accordingly, filter parameters can be varied. For example, the flux density of the MEC 500 can be decreased to increase the equivalent capacitance or the flux density can be increased to decrease the equivalent capacitance. Notably, an increase in equivalent capacitance can lower a cutoff frequency in the low pass, band pass, and high pass filters. Likewise, an increase in equivalent capacitance can increase the cutoff frequency in each of the filters. Additionally, the equivalent capacitance of the MEC 500 can be adjusted to shape a response curve of a circuit incorporating the MEC 500, as would be known to those skilled in the art of filter circuits.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

I claim:

1. A method for filtering an electrical signal comprising the steps of:
   rotating a conductive disc about an axis;
   applying a magnetic field to said conductive disc in a direction that is generally parallel to said axis;
   electrically connecting a first and second conductor to said disc at radially spaced locations thereon; and
   connecting said first and second conductors in at least one of a series and parallel configuration for capacitively filtering a signal.

2. The method according to claim 1 further comprising the step of varying an intensity of said magnetic field to control a filter response.

3. The method according to claim 2 further comprising the step of varying said intensity in response to a control signal for controlling said filter response.

4. The method according to claim 1 further comprising the step of selecting a thickness of said conductive disc for producing a desired filter response.

5. The method according to claim 1 further comprising the step of selecting a mass density of said conductive disc for producing a desired filter response.

6. The method according to claim 1 further comprising the step of connecting at least one of said first and second conductors to at least one inductor in at least one of a series and a parallel configuration for controlling a filter response.

7. The method according to claim 1 wherein said first and second conductors connected to said conductive disc rotating in said magnetic field defines an electro-mechanical capacitor and further comprising the step of electrically connecting said electro-mechanical capacitor to at least a second electro-mechanical capacitor in at least one of a series and a parallel configuration to control a filter response.

8. The method according to claim 1 further comprising the step of forming said conductive disc in a recess formed in a substrate.

9. The method according to claim 8 further comprising the step of forming a printed circuit on said substrate.

10. The method according to claim 8 further comprising the step of forming an integrated circuit on said substrate.

11. A filter circuit comprising:
    a conductive disc rotatable about an axis;
    a magnetic field source arranged for applying a magnetic field to said conductive disc in a direction that is generally parallel to said axis;
    a first and second conductor electrically connected to said disc at radially spaced locations thereon; and
    wherein said first and second conductors are connected in at least one of a series and parallel configuration for capacitively filtering a signal.

12. The filter circuit according to claim 11, further comprising a control circuit coupled to said magnetic field source for varying an intensity of said magnetic field to control a filter response.

13. The filter circuit according to claim 11 further comprising at least one inductor connected to at least one of said first and second conductors, said at least one inductor connected in at least one of a series and a parallel configuration.

14. The filter circuit according to claim 11, wherein an effective capacitance associated with said conductors is proportional to a thickness of said conductive disc.

15. The filter circuit according to claim 11, wherein an effective capacitance associated with said conductors is proportional to a mass density of said conductive disc.

16. The filter circuit according to claim 11, wherein said first and second conductors connected to said conductive disc rotating in said magnetic field defines an electro-mechanical capacitor, said filter circuit further comprising at least a second electro-mechanical capacitor electrically connected to said electro-mechanical capacitor in at least one of a series and a parallel configuration.

17. The filter circuit according to claim 11 further comprising a recess formed in a substrate, said conductive disc disposed in said recess.

18. The filter circuit according to claim 17 further comprising a printed circuit disposed on said substrate.

19. The filter circuit according to claim 17 further comprising an integrated circuit formed on said substrate.

20. The filter circuit according to claim 17, wherein a material forming said substrate is selected from the group consisting of a ceramic and a semiconductor.

21. The filter circuit according to claim 20, wherein said substrate is a low temperature co-fired ceramic.

22. The filter circuit according to claim 11, wherein said filter circuit is selected from the group consisting of a low pass filter circuit, a band pass filter circuit, and high pass filter circuit, and band notch filter circuit and an all pass filter circuit.

23. A continuously variable filter circuit, comprising:
    at least one microelectromechanical capacitor integrally formed on a substrate, said microelectromechanical capacitor having a variable capacitance and comprising a continuously variable magnetic field source;
    wherein said microelectromechanical capacitor filters electricity propagating on a conductor.

* * * * *

UNITED STATES PATENT AND TRADEMARK OFFICE
CERTIFICATE OF CORRECTION

PATENT NO. : 6,664,691 B1
DATED : December 16, 2003
INVENTOR(S) : Koeneman

It is certified that error appears in the above-identified patent and that said Letters Patent is hereby corrected as shown below:

Column 3,
Line 31, delete "$\Omega_m$" and replace with -- $\omega_m$ --

Signed and Sealed this

Twenty-first Day of December, 2004

JON W. DUDAS
*Director of the United States Patent and Trademark Office*